US012584963B2

(12) United States Patent
Ki et al.

(10) Patent No.: US 12,584,963 B2
(45) Date of Patent: Mar. 24, 2026

(54) STUCK-CLOSED DIAGNOSIS METHOD AND BATTERY SYSTEM USING THE SAME

(71) Applicant: LG Energy Solution, Ltd., Seoul (KR)

(72) Inventors: Jeong Seok Ki, Daejeon (KR); Younghwan Jeon, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 160 days.

(21) Appl. No.: 18/715,244

(22) PCT Filed: Jan. 3, 2023

(86) PCT No.: PCT/KR2023/000094
§ 371 (c)(1),
(2) Date: May 31, 2024

(87) PCT Pub. No.: WO2023/132604
PCT Pub. Date: Jul. 13, 2023

(65) Prior Publication Data
US 2025/0027997 A1 Jan. 23, 2025

(30) Foreign Application Priority Data

Jan. 6, 2022 (KR) ......................... 10-2022-0002133

(51) Int. Cl.
*G01R 31/327* (2006.01)
*G01R 19/10* (2006.01)
(Continued)

(52) U.S. Cl.
CPC ......... *G01R 31/3278* (2013.01); *G01R 19/10* (2013.01); *G01R 19/16571* (2013.01); *G01R 19/16576* (2013.01); *H01M 10/425* (2013.01); *H01M 2010/4271* (2013.01)

(58) Field of Classification Search
CPC ................ G01R 31/3278; G01R 19/10; G01R 19/16571; G01R 19/16576
See application file for complete search history.

(56) References Cited

U.S. PATENT DOCUMENTS 6,362,627 B1 * 3/2002 Shimamoto ............ G01R 19/25
324/73.1
7,964,985 B2 * 6/2011 Ozaki ..................... B60L 50/16
307/10.1
(Continued)

FOREIGN PATENT DOCUMENTS

EP          3754350 A1   12/2020
JP     2010004693 A       1/2010
(Continued)

OTHER PUBLICATIONS

Extended European Search Report including Written Opinion for Application No. 23737352.7 dated Jan. 29, 2025. 6 pages.
(Continued)

*Primary Examiner* — Walter L Lindsay, Jr.
*Assistant Examiner* — Milton Gonzalez
(74) *Attorney, Agent, or Firm* — Lerner David LLP

(57) ABSTRACT
A battery system includes: a plurality of battery packs; a plurality of positive relays, each respective battery pack including a respective positive relay, connected between a positive electrode and a positive link of the respective battery pack; a plurality of negative relays, each respective battery pack including a respective negative relay, connected between a negative electrode and a negative link of the respective battery pack; and a plurality of pack BMSs (Battery Management Systems) connected to the plurality of battery packs in a one-to-one correspondence. Each pack BMS of the plurality of pack BMSs, in an opening control condition of the plurality of positive relays and the plurality of negative relays, may be configured to determine whether the positive relay of the pack BMS's corresponding battery pack is stuck-closed based on a first battery pack current flowing to the pack BMS's corresponding battery pack.

11 Claims, 12 Drawing Sheets

(51) Int. Cl.
    *G01R 19/165*     (2006.01)
    *H01M 10/42*     (2006.01)

(56) References Cited

U.S. PATENT DOCUMENTS

| | | | |
|---|---|---|---|
| 10,464,507 B2 * | 11/2019 | Yang ...................... | B63H 21/00 |
| 2013/0009648 A1 | 1/2013 | Tae | |
| 2017/0003353 A1 | 1/2017 | Seo | |
| 2018/0278066 A1 | 9/2018 | Kurahashi et al. | |
| 2020/0355746 A1 | 11/2020 | Ham et al. | |
| 2021/0005938 A1 | 1/2021 | Hayashi | |
| 2022/0155371 A1 | 5/2022 | Kang et al. | |
| 2022/0260637 A1 | 8/2022 | Park | |
| 2022/0404418 A1 | 12/2022 | Park | |
| 2023/0305059 A1 * | 9/2023 | Yamane .............. | H01M 10/425 |

FOREIGN PATENT DOCUMENTS

| | | |
|---|---|---|
| JP | 2017079496 A | 4/2017 |
| JP | 2017117618 A | 6/2017 |
| JP | 2018163100 A | 10/2018 |
| JP | 2021512574 A | 5/2021 |
| JP | 6963358 B2 | 11/2021 |
| KR | 100709841 B1 | 4/2007 |
| KR | 20130004827 A | 1/2013 |
| KR | 20160079507 A | 7/2016 |
| KR | 20160103294 A | 9/2016 |
| KR | 20180134205 A | 12/2018 |
| KR | 20200030393 A | 3/2020 |
| KR | 20200050865 A | 5/2020 |
| KR | 20200076423 A | 6/2020 |
| KR | 20210058717 A | 5/2021 |
| KR | 20210152637 A | 12/2021 |
| WO | 2014077522 A1 | 5/2014 |
| WO | 2021125678 A1 | 6/2021 |

OTHER PUBLICATIONS

International Search Report for PCT/KR2023/000094 mailed Apr. 3, 2023. 3 pages.

* cited by examiner

FIG. 6

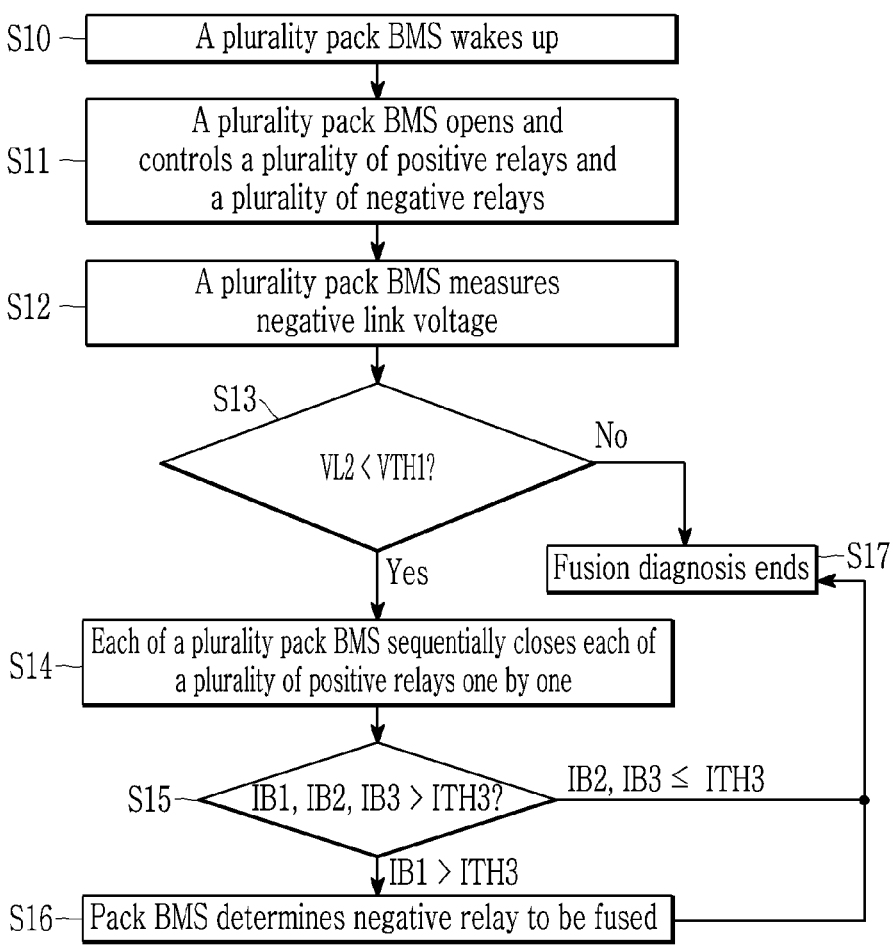

S10 — A plurality pack BMS wakes up

S11 — A plurality pack BMS opens and controls a plurality of positive relays and a plurality of negative relays S12 — A plurality pack BMS measures negative link voltage

S13 — VL2 < VTH1?

No → Fusion diagnosis ends — S17

Yes

S14 — Each of a plurality pack BMS sequentially closes each of a plurality of positive relays one by one

S15 — IB1, IB2, IB3 > ITH3?     IB2, IB3 ≤ ITH3

IB1 > ITH3

S16 — Pack BMS determines negative relay to be fused

S20 — A plurality pack BMS wakes up

S21 — A plurality pack BMS opens and controls a plurality of positive relays and a plurality of negative relays

S22 — IB1, IB2, IB3 > ITH5 ?

IB1, IB2, IB3 ≤ ITH5

IB1 > ITH5

S23 — Pack BMS determines positive relay and negative relay to be fused

S24 — Fusion diagnosis ends

S10~S17

S0 ~ S7

STUCK-CLOSED DIAGNOSIS METHOD AND BATTERY SYSTEM USING THE SAME

CROSS-REFERENCE TO RELATED APPLICATION

The present application is a national phase entry under 35 U.S.C. § 371 of International Application No. PCT/KR2023/000094 filed Jan. 3, 2023, which claims priority from Korean Patent Application No. 10-2022-0002133 filed in the Korean Intellectual Property Office on Jan. 6, 2022, the entire contents of which are incorporated herein by reference.

TECHNICAL FIELD

The present disclosure relates to a stuck-closed diagnosis method and a battery system using the same.

BACKGROUND ART

In general, during a time of a stuck-closed diagnosis for each of a positive relay connected to a positive electrode of a battery pack and a negative relay connected to a negative electrode of the battery pack, a voltage of the positive electrode of the battery pack and a voltage of a link connected to the positive relay, or the voltage of the negative electrode of the battery pack and the voltage of the link connected to the negative relay, are compared with each other. However, when a plurality of battery packs are connected in parallel, it is difficult to perform the stuck-closed diagnosis for each positive relay and negative relay of a plurality of battery packs in the same manner as above.

In addition, even if the stuck-closed diagnosis occurs, it's hard to know which battery pack's positive relay or negative relay among a plurality of battery packs has been stuck-closed, and how many battery packs among a plurality of battery packs are connected to the positive relay and the negative relay where the stuck-closed occurred.

SUMMARY

Technical Problem

It is intended to provide a method that may accurately diagnose whether or not there is stuck-closed for each of a plurality of relays when a plurality of battery packs is connected in parallel.

Technical Solution

A battery system according to one feature of the present invention may include: a plurality of battery packs; a plurality of positive relays, each respective battery pack including a respective positive relay, connected between a positive electrode and a positive link of the respective battery pack; a plurality of negative relays, each respective battery pack including a respective relay, connected between a negative electrode and a negative link of the respective battery pack; and a plurality of pack BMSs (Battery Management Systems) connected to the plurality of battery packs in a one-to-one correspondence. Each pack BMS of the plurality of pack BMSs, in an opening control condition of the plurality of positive relays and the plurality of negative relays, may be configured to determine whether the positive relay of the pack BMS's corresponding battery pack is stuck-closed based on a first battery pack current flowing to the pack BMS's corresponding battery pack when the negative relay connected to the pack BMS's corresponding battery pack is closed when a voltage difference between terminals of the positive relay of the pack BMS's corresponding battery pack is less than a first threshold voltage.

Each pack BMS of the plurality of pack BMSs may be configured to determine the positive relay connected to the pack BMS's corresponding battery pack to be stuck-closed when the first battery pack current is greater than a first threshold current.

In the opening control condition of the plurality of positive relays and the plurality of negative relays, when the voltage difference between terminals of at least one of the plurality of positive relays is less than the first threshold voltage, the plurality of pack BMSs may be configured to sequentially measure respective second battery pack currents flowing through each of the plurality of battery packs while sequentially closing each of the plurality of negative relays one by one.

In the opening control condition of the plurality of positive relays and the plurality of negative relays, when a voltage of the negative link is less than a second threshold voltage, each pack BMS of the plurality of pack BMSs may be configured to determine whether the negative relay of the pack BMS's corresponding battery pack is stuck-closed based on a second battery pack current flowing through the pack BMS's corresponding battery pack as each of the plurality of positive relays is sequentially closed one by one.

Each pack BMS of the plurality of pack BMSs may be configured to determine the negative relay of the pack BMS's corresponding battery pack to be stuck-closed when the second battery pack current is larger than a second threshold current.

Each pack BMS of the plurality of pack BMSs may be configured to determine the positive relay and the negative relay of the pack BMS's corresponding battery pack to be stuck-closed when a battery pack current of any pack BMS's corresponding battery pack is larger than a third threshold current.

A battery system according to another feature of the invention may include: a plurality of battery packs; a plurality of positive relays, each respective battery pack including a respective relay, connected between a positive electrode and a positive link of the respective battery pack; a plurality of negative relays, each respective battery pack including a respective negative relay, connected between a negative electrode and a negative link of the respective battery pack; and a plurality of pack BMSs (Battery Management Systems) connected to the plurality of battery packs in a one-to-one correspondence. Each pack BMS of the plurality of pack BMSs, in an opening control condition of the plurality of positive relays and the plurality of negative relays, may be configured to determine at least one positive relay and at least one negative relay to which at least one battery pack current among a plurality of battery packs flows to be stuck-closed when a battery pack current of any pack BMS's corresponding battery pack is larger than a third threshold current.

Each pack BMS of a plurality of pack BMSs, in an opening control condition of the plurality of positive relays and the plurality of negative relays, when all of the plurality of battery pack currents are below the third threshold current, may be configured to determine a positive relay connected to the pack BMS's corresponding battery pack is stuck-closed based on a first battery pack current flowing to the corresponding battery pack when a negative relay connected to the pack BMS's corresponding battery pack is closed, when a voltage difference between terminals of the positive relay of the pack BMS's corresponding battery pack is less than a first threshold voltage.

Each pack BMS of the plurality of pack BMSs, in the opening control condition of the plurality of positive relays and the plurality of negative relays, when all of the plurality of battery pack currents are below the third threshold current, may be configured to determine whether a negative relay connected to the pack BMS's corresponding battery pack is stuck-closed based on a second battery pack current flowing to the pack BMS's corresponding battery pack when a positive relay connected to the pack BMS's corresponding battery pack is closed, when a voltage of the negative link is less than a second threshold voltage.

In a stuck-closed diagnosis method for a plurality of positive relays, each respective battery pack including a respective positive relay, connected to a positive electrode of the respective battery pack and a negative relay of the respective battery pack, each pack BMS of a plurality of pack BMSs connected to the respective battery pack may be configured to perform: comparing a voltage difference between terminals of each of the plurality of positive relays with a first threshold voltage in an opening control condition and each of the plurality of negative relays; sequentially closing the plurality of negative relays one by one when at least one of the voltage difference is less than the first threshold voltage; comparing a respective battery pack current flowing through each of the plurality of battery packs with a first threshold current; and determining at least one positive relay to be stuck-closed when at least one of a plurality of battery pack currents flowing through each of the plurality of battery packs is greater than a first threshold current.

In a stuck-closed diagnosis method for a plurality of positive relays, each respective battery pack including a respective positive relay, connected to a positive electrode of the respective battery pack and a negative relay of the respective battery pack, each pack BMS of a plurality of pack BMSs connected to the respective battery pack may be configured to perform: comparing a voltage of a negative link connected to the negative electrode of the pack BMS's corresponding battery pack with a threshold voltage in an opening control condition of the plurality of positive relays and the plurality of negative relays; sequentially closing the plurality of positive relays one by one when the voltage of the negative link is less than a second threshold voltage; comparing a battery pack current flowing through each of the plurality of battery packs with a second threshold current; and determining at least one negative relay to be stuck-closed when at least one of a plurality of battery pack currents flowing through each of the plurality of battery packs is greater than the second threshold current.

Advantageous Effects

The present invention provides the stuck-closed diagnosis method capable of accurately diagnosing the stuck-closed for each of a plurality of relays when a plurality of battery packs are connected in parallel, and the battery system using the same.

BRIEF DESCRIPTION OF THE DRAWINGS

FIG. 6 is a flowchart for explaining a method for determining whether a plurality of negative relays are stuck-closed according to an embodiment.

DETAILED DESCRIPTION

Figure 1:
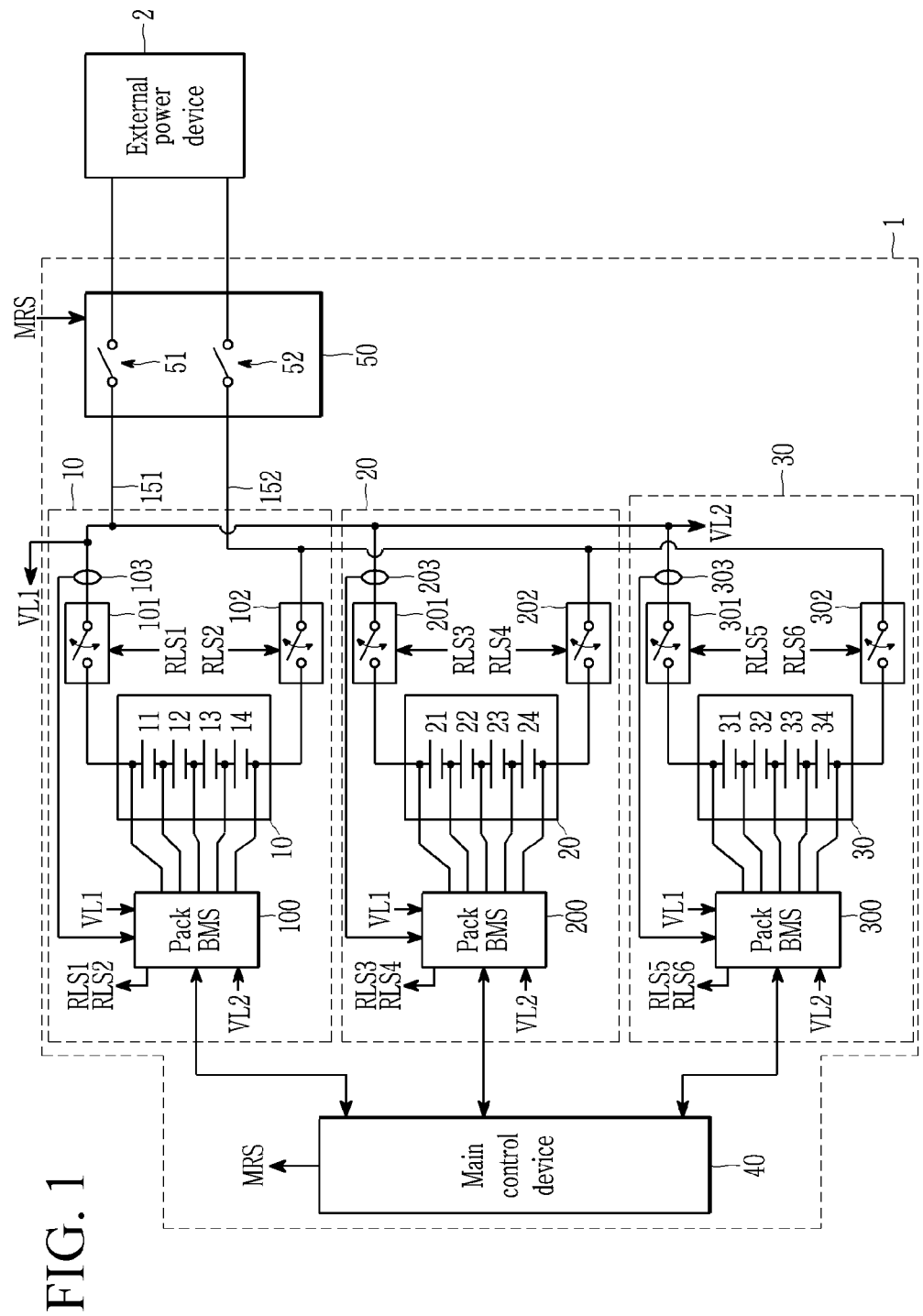
FIG. 1 is a view showing a battery system according to an embodiment.

Embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to make the specification easier. Therefore, these terms do not have meanings or roles that distinguish them from each other by themselves. In describing embodiments of the present specification, when it is determined that a detailed description of the well-known art associated with the present invention may obscure the gist of the present invention, it will be omitted. The accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not to be interpreted as limiting these components. The terms are only used to differentiate one component from others.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "connected or coupled directly" to another component, it may be connected or coupled to another component without another component intervening therebetween.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof.

FIG. 1 is a view showing a battery system according to an embodiment.

A battery system 1 includes a plurality of battery packs 10 to 30, a main control IC (Main Control Integrated Circuit) 40, and a junction device 50. FIG. 1 shows that the number of a plurality of battery packs is three, but the invention is not limited thereto, and the battery system 1 may include four or more battery packs. Also, in FIG. 1, a plurality of battery packs 10-30 are illustrated as being connected in parallel, but two or more battery packs may be connected in series and a plurality of battery packs that are connected in series may be connected in parallel.

The external power device 2 may be a load receiving power from the battery system 1 or a charger for charging the battery system 1. For example, the external power device 2 may include at least one of an inverter, a DC-DC converter, a motor, an electronic control circuit, an on-board charger (OBC), and a fast charger of a vehicle including the battery system 1.

A plurality of battery packs 10 to 30 are connected in parallel to each other, and each of both terminals of a plurality of battery packs 10 to 30 are connected to the junction device 50 through a line 151 and a line 152, respectively. The junction device 50 may include a first main relay 51 connected between the line 151 and the external power device 2, and a second main relay 52 connected between the line 152 and the external power device 2. The first and second main relays 51 and 52 control the connection between a plurality of battery packs 10 to 30 and the external power device 2, and the main control IC 40 may generate and transmit a relay control signal MRS that controls the operation of the first and second main relays 51 and 52 to the junction device 50. The junction device 50 may control the opening and closing of the first and second main relays 51 and 52 according to the relay control signal MRS. In FIG. 1, the junction device 50 is illustrated as including a pair of main relays, but the number of main relay pairs may be determined according to the number of configurations of the external power device 2.

Each of a plurality of battery packs 10 to 30 includes a plurality of battery cells 11 to 14, 21 to 24, and 31 to 34, a plurality of pack battery management systems 100, 200, and 300, two relays 101, 102, 201, 202, 301, and 302, and current sensors 103, 203, and 303. The battery pack battery management system is hereinafter referred to as a battery pack BMS (Battery Management System). FIG. 1 shows that each of a plurality of battery packs 10 to 30 includes four battery cells 11 to 14, 21 to 24, and 31 to 34, but this is an example and the invention is not limited thereto. Also, each of a plurality of battery packs 10 to 30 is illustrated as including two relays, but this is an example, and the number of relays may be at least one.

Each of a plurality of pack BMSs 100, 200, and 300 is connected to a plurality of battery cells 11 to 14, 21 to 24, and 31 to 34 to measure a cell voltage of a plurality of battery cells 11 to 14, 21 to 24, and 31 to 34. Each of a plurality of pack BMSs 100, 200, and 300 may obtain a voltage (hereinafter, a battery pack voltage), a current (hereinafter, a battery pack current), and a temperature (hereinafter, a temperature of the battery pack) of each of the battery packs 10, 20, and 30. Each of a plurality of pack BMSs 100, 200, and 300 may control the charge and discharge of the battery packs 10 to 30 based on the cell voltage, battery pack current, and the like of a plurality of battery cells 11 to 14, 21 to 24, and 31 to 34, and may control and perform the cell balancing operation for a plurality of battery cells 11 to 14, 21 to 24, and 31 to 34.

A plurality of pack BMSs 100, 200, and 300 may control the opening and closing of each of a plurality of relays 101, 102, 201, 202, 301, and 302 for controlling the charge and discharge of a plurality of battery packs 10 to 30. A plurality of pack BMSs 100, 200, and 300 may each generate two driving signals RLS1/RLS2, RLS3/RLS4, and RLS5/RLS6 that control the opening and closing of two relays 101/102, 201/202, and 301/302 to be supplied to two relays 101/102, 201/202, and 301/302.

The main control IC 40 may receive the cell voltage of a plurality of battery cells 11 to 14, 21 to 24, and 31 to 34, the information for the battery pack voltage, the battery pack current, and the battery pack temperature of the plurality of battery packs 10, 20, and 30 from the plurality of pack BMSs 100, 200, and 300. The main control IC 40 may supply a power control signal to a plurality of pack BMSs 100, 200, and 300 for supplying power to the outside, or a charge control signal for the charge of a plurality of battery packs 10, 20, and 30 to a plurality of pack BMSs 100, 200, and 300. In addition, the main control circuit 40 may perform control necessary for the operation of the battery system 1, and when an abnormal state of the battery system 1 is detected, a protection operation may be started and controlled.

In an embodiment, it is described that a plurality of pack BMSs 100, 200, and 300 determine whether a plurality of relays 101/102, 201/202, and 301/302 are stuck-closed. However, the present invention is not limited thereto, and the main control IC 40 determines whether or not the plurality of relays 101/102, 201/202, and 301/302 are stuck-closed based on the cell information received from a plurality of pack BMSs 100, 200, and 300. Hereinafter, among a plurality of relays 101/102, 201/202, and 301/302, the relay connected to the positive electrode of the battery pack is referred to as a positive relay, and the relay connected to the negative electrode of the battery pack is referred to as a negative relay.

Each of a plurality of pack BMSs 100, 200, and 300 is connected to both terminals of each of a plurality of positive relays 101, 201, and 301, thereby calculating a voltage difference between both terminals. For example, one terminal of each of a plurality of positive relays 101, 201, and 301 is connected to the positive electrode of each of a plurality of battery packs 10, 20, and 30, and the other terminal of each of a plurality of positive relays 101, 201, and 301 is connected to the wiring 151. The voltage of one terminal of each of a plurality of positive relays 101, 201, and 301 may be the same as the positive electrode voltage of each battery pack, and the voltage of the other terminal of each of the plurality of positive relays 101, 201, and 301 may be the same as the voltage (hereinafter, a positive link voltage) of the positive link. The positive link may be the wiring 151 connecting the positive electrode of the plurality of battery packs 10, 20, and 30, and the external power device 2.

Since each of the plurality of pack BMSs 100, 200, and 300 is connected to the positive electrode of each of the plurality of battery packs 10, 20, and 30, the positive electrode voltage of each of the plurality of battery packs 10, 20, and 30 may be measured A plurality of pack BMSs 100, 200, and 300 may be connected to the wiring 151 to measure the positive electrode voltage. A plurality of pack BMSs 100, 200, and 300 include a switch (not shown) connected to the wiring 151, and the switch may be turned on to measure the positive link voltage.

One terminal of each of a plurality of negative relays 102, 202, and 302 is connected to a negative electrode of each of a plurality of battery packs 10, 20, and 30, and the other terminal of each of a plurality of negative relays 102, 202, and 302 is connected to the wiring 152. The voltage of the other terminal of each of the plurality of negative relays 102, 202, and 302 may be the same voltage as the voltage (hereinafter, a negative link voltage) of the negative electrode link. The negative link may be the wiring 152 connecting the negative electrodes of a plurality of battery packs 10, 20, and 30 to the external power device 2. Each of a plurality of pack BMSs 100, 200, and 300 may be connected to the wiring 152 to measure the negative link voltage. A plurality of pack BMSs 100, 200, and 300 include a switch (not shown) connected to the wiring 152, and the switch may be turned on to measure the negative link voltage.

Each of the plurality of current sensors 103, 203, and 303 may measure the battery pack current and transmit a signal indicating the measured current to each of the plurality of pack BMSs 100, 200, and 300.

Hereinafter, a method for determining whether two relays connected to each of a plurality of battery packs 10, 20, and 30 are stuck-closed will be described with reference to FIG. 2 to FIG. 10.

Figure 2:
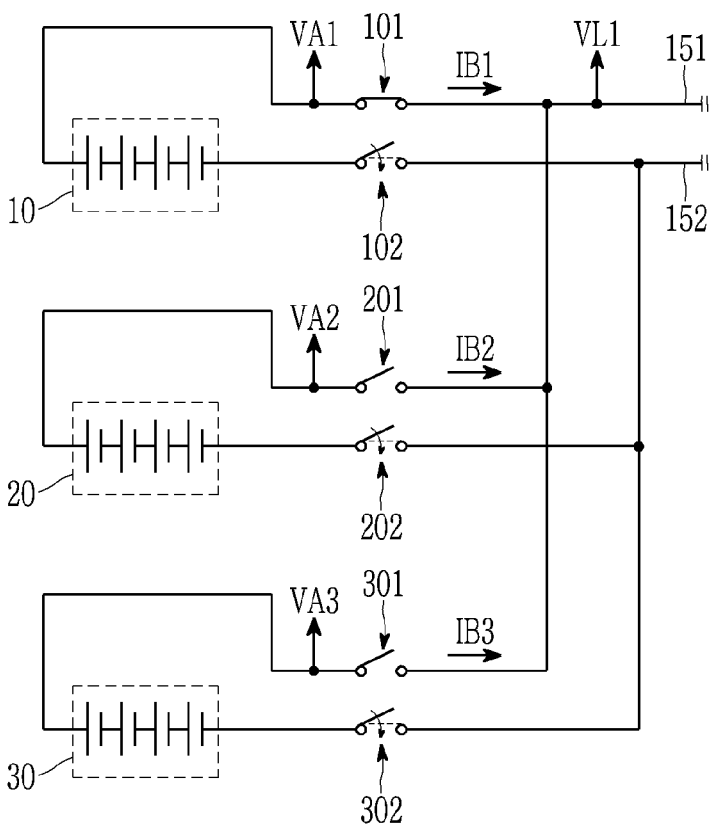
FIG. 2 is a circuit diagram for explaining a method for determining whether a plurality of positive relays are stuck-closed according to an embodiment.

FIG. 2 is a circuit diagram for explaining a method for determining whether a plurality of positive relays are stuck-closed according to an embodiment.

Figure 3:
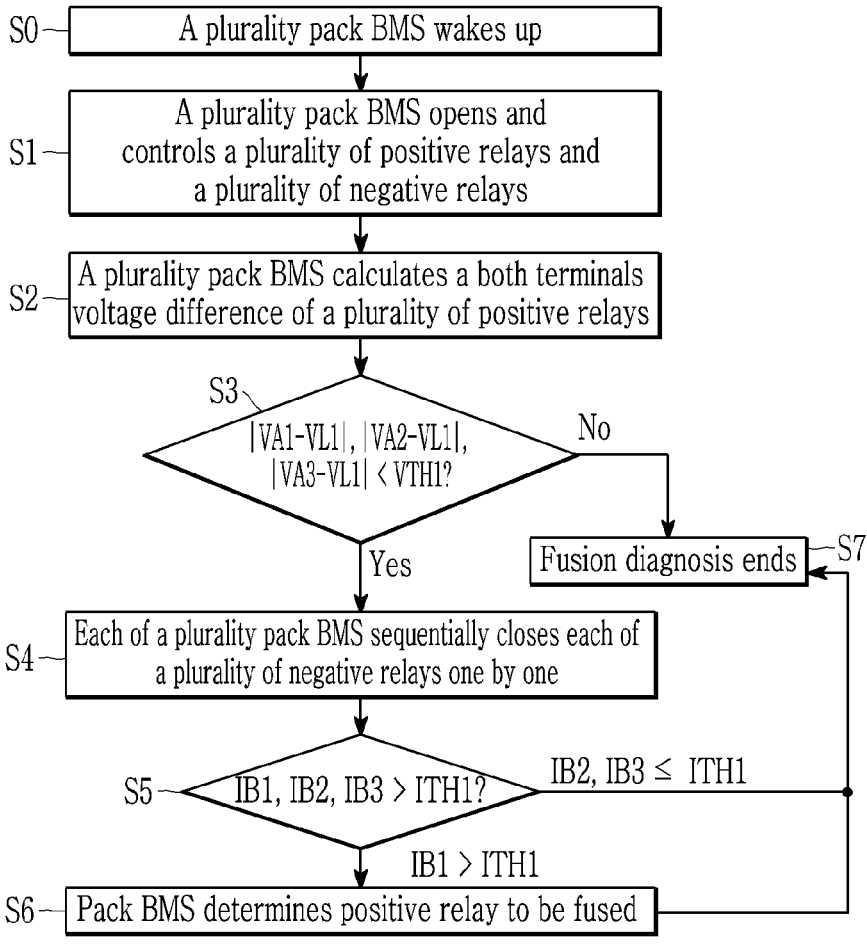
FIG. 3 is a flowchart for explaining a method for determining whether a plurality of positive relays are stuck-closed according to an embodiment.

FIG. 3 is a flowchart for explaining a method for determining whether a plurality of positive relays are stuck-closed according to an embodiment.

FIG. 2 shows a plurality of battery packs 10, 20, and 30, a plurality of positive relays 101, 201, and 301 and a plurality of negative relays 102, 202, and 302 connected to each battery pack for convenience of description. In addition, FIG. 2 shows the positive relay 101 in a stuck-closed state. In FIG. 2, the closed state of a plurality of negative relays 102, 202, and 302 is shown by a dotted line.

First, each of a plurality of pack BMSs 100, 200, and 300 may wake up for a stuck-closed diagnosis (S0). A monitoring operation for diagnosing the state of the battery system 1 may be performed by a plurality of pack BMSs 100, 200, and 300. For example, a plurality of pack BMSs 100, 200, and 300 may wake up every monitoring period to determine whether each of the plurality of positive relays 101, 201, and 301 is stuck-closed.

A plurality of pack BMSs 100, 200, and 300 may open and control a plurality of positive relays 101, 201, and 301 and a plurality of negative relays 102, 202, and 302 (S1).

A plurality of pack BMSs 100, 200, and 300 may calculate both terminals voltage differences of a plurality of positive relays 101, 201, and 301 (S2). For example, each of a plurality of pack BMSs 100 measures the voltages VA1, VA2, and VA3 of one terminal of each of a plurality of positive relays 101, 201, and 301 and the positive link voltage VL1, and may calculate an absolute value of the voltage value obtained by subtracting the positive link voltage VL1 from the voltages VA1, VA2, and VA3 of one terminal as both terminals voltage differences of a plurality of positive relays 101, 201, and 301, respectively.

A plurality of pack BMSs 100, 200, and 300 compare a plurality of the both terminals voltage differences |VA1−VL1|, |VA2−VL1|, and |VA3−VL1| and a first threshold voltage VTH1 (S3). As a comparison result, when a plurality of both terminals voltage differences VA1−VL1|, |VA2−VL1|, and |VA3−VL1‖ is greater than or equal to the first threshold voltage, a plurality of pack BMSs 100, 200, and 300 end the stuck-closed diagnosis for a plurality of positive relays 101, 201, and 301 (S7).

When one of the plurality of positive relays 101, 201, and 301 is stuck-closed, the positive link voltage VL1 may be similar to the positive electrode voltage of the battery pack supplied through the stuck-closed positive relay. Since a plurality of battery packs 10, 20, and 30 are operated in a parallel connection state, in the opening control condition of the positive relay and the negative relay, the positive electrode voltages of a plurality of battery packs 10, 20, and 30 may be within a substantially similar range. Therefore, by the stuck-closed positive relay, the both terminals voltage differences |VA1−VL1|, |VA2−VL1|, and |VA3−VL1| of all of a plurality of positive relays 101, 201, and 301 may be less than the first threshold voltage VTH1. Conversely, if all of a plurality of positive relays 101, 201, and 301 are not stuck-closed, a plurality of both terminals voltage differences |VA1−VL1|, |VA2−VL1|, and |VA3−VL1| may all be equal to or greater than the first threshold voltage VTH1.

As a comparison result, when at least one of a plurality of the both terminals voltage differences |VA1−VL1|, |VA2−VL1|, and |VA3−VL1| is less than the first threshold voltage VTH1, each of the plurality of pack BMSs 100, 200, and 300 may be sequentially close to each of the plurality of negative relays 102, 202, and 302 one by one (S4). An order in which each of the plurality of pack BMSs 100, 200, and 300 are close to the corresponding negative relays may be controlled by the main control device 40. The main control device 40 may close the junction device 50 while measuring a plurality of battery pack currents IB1, IB2, and IB3. As shown in the dotted line shown in FIG. 2, each of a plurality of negative relays 102, 202, and 302 is sequentially closed one by one.

Each of a plurality of pack BMSs 100, 200, and 300 compares each of a plurality of battery pack currents IB1, IB2, and IB3 measured by a plurality of current sensors 103, 203, and 303 with a first threshold current ITH1 (S5).

If the battery pack current IB1 among a plurality of battery pack currents IB1, IB2, and IB3 is greater than first threshold current ITH1, the pack BMS 100 may determine that the positive relay 101 is stuck-closed (S6).

If the battery pack currents IB2 and IB3 are less than or equal to the first threshold current ITH1, a plurality of pack BMSs 200 and 300 terminate the stuck-closed diagnosis, and the pack BMS 100 also terminates the stuck-closed diagnosis after determining the stuck-closed for the positive relay 101 (S7).

A plurality of pack BMSs 100, 200, and 300 may transmit a stuck-closed diagnosis result to the main control device 40. The main control device 40 may control the junction device 50 in an open state when there is a stuck-closed positive relay. In addition, the main control device 40 may perform an operation to notify the stuck-closed of the positive relay 101. For example, information indicating the stuck-closed of the positive relay 101 may be transmitted to a vehicle equipped with the battery system 1 through CAN communication.

Figure 4:
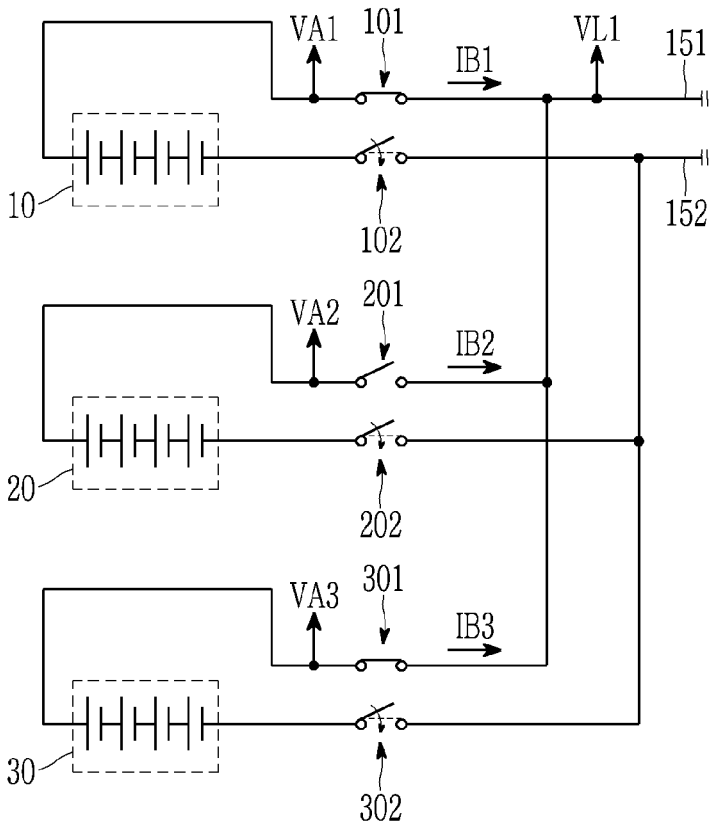
FIG. 4 is a circuit diagram for explaining a method for determining whether a plurality of positive relays are stuck-closed according to an embodiment.

FIG. 4 is a circuit diagram for explaining a method for determining whether a plurality of positive relays are stuck-closed according to an embodiment.

In FIG. 4, unlike FIG. 2, two positive relays 101 and 301 are shown in a stuck-closed state. Hereinafter, contents overlapping with those described above will be omitted.

As shown in FIG. 4, since two positive relays 101 and 301 are in a stuck-closed state, a plurality of both terminals voltage differences |VA1−VL1|, |VA2−VL1|, and |VA3−VL1| of a plurality of positive relays 101, 201, and 301 may be smaller than the first threshold voltage VTH1.

Each of a plurality of pack BMSs 100, 200, and 300 may sequentially close each of a plurality of negative relays 102, 202, and 302 one by one, and compare each of a plurality of battery pack currents IB1, IB2, and IB3 flowing through each of a plurality of battery packs 10, 20, and 30 with the first threshold current ITH1.

As a comparison result, among a plurality of battery pack currents IB1, IB2, and IB3, if the battery pack currents IB1 and IB3 are greater than the first threshold current ITH1, the pack BMSs 100 and 300 may determine that the positive relays 101 and 103 are stuck-closed.

The first threshold current ITH1 may be set considering the case where two or more battery positive relays are stuck-closed. For example, when two or more battery positive relays are stuck-closed, the number of the current paths supplied to the vehicle depends on the number of the stuck-closed positive relays. Therefore, compared to the case where one positive relay is stuck-closed, when two or more positive relays are stuck-closed, the battery pack current flowing through the stuck-closed positive relay may be reduced. The first threshold current ITH1 should be set in consideration of these points.

Figure 5:
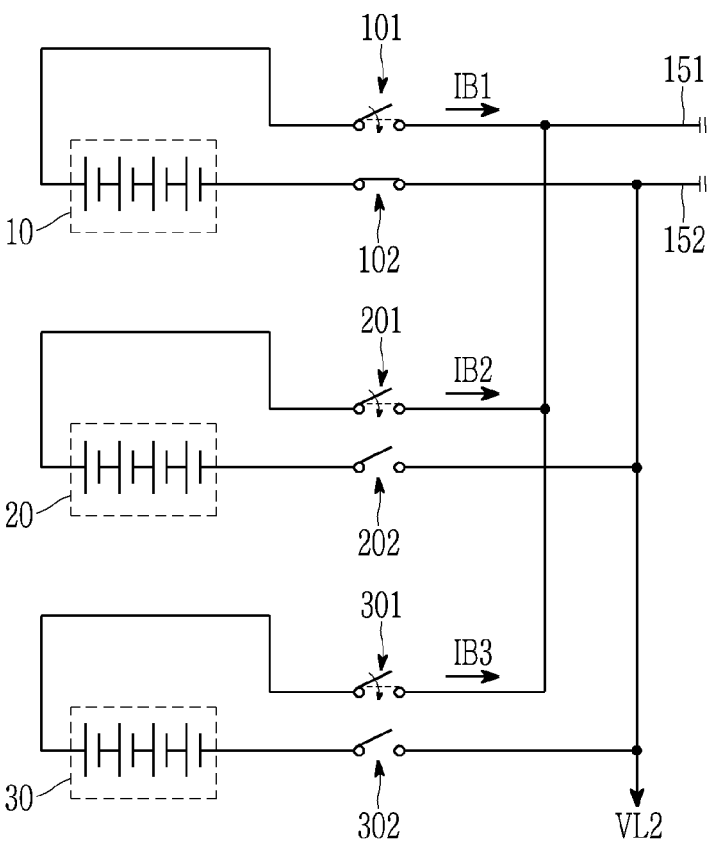
FIG. 5 is a circuit diagram for explaining a method for determining whether a plurality of negative relays are stuck-closed for according to an embodiment.

FIG. 5 is a circuit diagram for explaining a method for determining whether a plurality of negative relays are stuck-closed according to an embodiment.

FIG. 6 is a flowchart for explaining a method for determining whether a plurality of negative relays are stuck-closed according to an embodiment.

FIG. 5 shows a plurality of battery packs 10, 20, and 30, a plurality of positive relays 101, 201, and 301 and a plurality of negative relays 102, 202, and 302, which are connected to each battery pack for convenience of description. In addition, in FIG. 5, the negative relay 102 is shown in a stuck-closed state. In FIG. 5, a closed state of a plurality of positive relays 101, 201, and 301 is shown by a dotted line.

First, each of a plurality of pack BMSs 100, 200, and 300 may wake up for the stuck-closed diagnosis (S10). A monitoring operation for diagnosing the state of battery system 1 may be performed by a plurality of pack BMSs 100, 200, and 300. For example, a plurality of pack BMSs 100, 200, and 300 may wake up every monitoring period to determine whether each of the plurality of negative relays 102, 202, and 302 is stuck-closed.

A plurality of pack BMSs 100, 200, and 300 may open and control a plurality of positive relays 101, 201, and 301 and a plurality of negative relays 102, 202, and 302 (S11).

A plurality of pack BMSs 100, 200, and 300 may measure the negative link voltage VL2 (S12).

A plurality of pack BMSs 100, 200, and 300 may compare the negative link voltage VL2 and the second threshold voltage VHT2 (S13). As a comparison result, when the negative link voltage VL2 is greater than or equal to the second threshold voltage VHT2, a plurality of pack BMSs 100, 200, and 300 end the stuck-closed diagnosis for a plurality of negative relays 102, 202, and 302 (S17).

As a comparison result, when the negative link voltage VL2 is less than the second threshold voltage VTH2, each of a plurality of pack BMSs 100, 200, and 300 sequentially closes each of a plurality of positive relays 101, 201, and 301 one by one (S14). An order in which each of the plurality of pack BMSs 100, 200, and 300 close the corresponding positive relays may be controlled by the main control device 40. The main control device 40 may close the junction device 50 while measuring a plurality of battery pack currents IB1, IB2, and IB3. Like the dotted line shown in FIG. 5, each of a plurality of positive relays 101, 201, and 301 is sequentially closed.

Each of a plurality of pack BMSs 100, 200, and 300 compares each of a plurality of battery pack currents IB1, IB2, and IB3 measured by each of a plurality of current sensors 103, 203, and 303 with the second threshold current ITH2 (S15).

If the battery pack current IB1 among a plurality of battery pack currents IB1, IB2, and IB3 is greater than the second threshold current ITH2, the pack BMS 100 may determine that the negative relay 102 is stuck-closed (S16).

When the battery pack currents IB2 and IB3 are less than the second threshold current ITH2, a plurality of pack BMSs 200 and 300 end the stuck-closed diagnosis, and the pack BMS 100 determines the stuck-closed for the negative relay 102 and then ends the stuck-closed diagnosis (S17).

A plurality of pack BMSs 100, 200, and 300 may transmit the stuck-closed diagnosis result to the main control device 40. The main control device 40 may control the junction device 50 in an open state when there is the stuck-closed negative relay. In addition, the main control device 40 may perform the operation to notify the stuck-closed of the negative relay 102. For example, the information indicating the stuck-closed of the negative relay 102 may be transmitted to a vehicle equipped with the battery system 1 through CAN communication.

Figure 7:
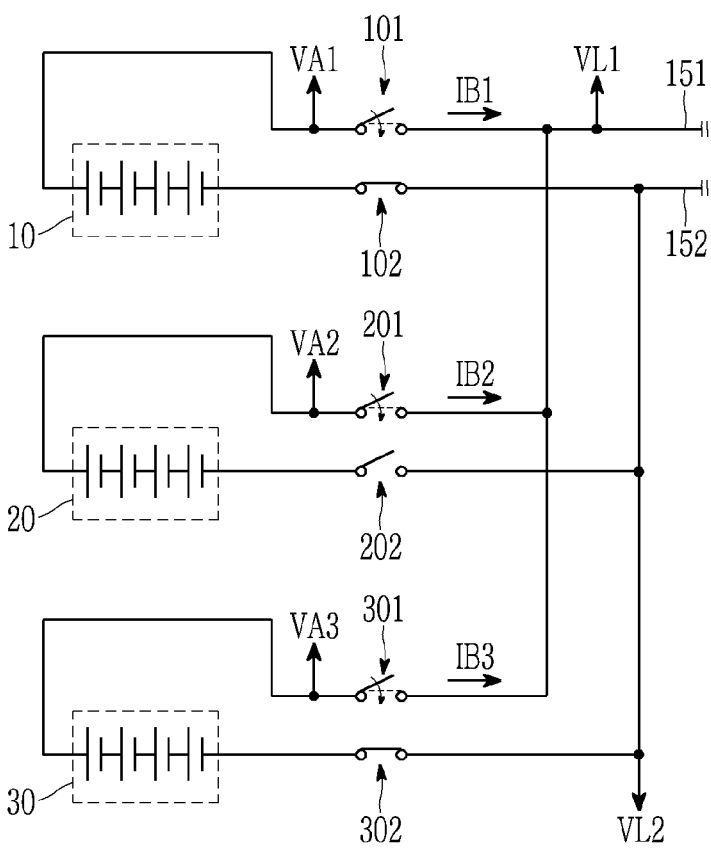
FIG. 7 is a circuit diagram for explaining a method for determining whether a plurality of negative relays are stuck-closed according to an embodiment.

FIG. 7 is a circuit diagram for explaining a method for determining whether a plurality of negative relays are stuck-closed according to an embodiment.

FIG. 7, unlike FIG. 5, shows two negative relays 102 and 302 in a stuck-closed state. Hereinafter, contents overlapping with those described above are omitted.

As shown in FIG. 7, since the two negative relays 102 and 302 are in the stuck-closed state, the negative link voltage VL2 is less than the second threshold voltage VTH2.

Each of a plurality of pack BMSs 100, 200, and 300 may sequentially close one by one each of a plurality of positive relays 101, 201, and 301, and compare each of a plurality of battery pack currents IB1, IB2, and IB3 with a second threshold current ITH2.

If the battery pack currents IB1 and IB3 among a plurality of battery pack currents IB1, IB2, and IB3 are greater than a fourth threshold current ITH4, the pack BMSs 100 and 300 may determine that the negative relays 102 and 302 are stuck-closed.

The second threshold current ITH2 may be set considering the case where two or more battery negative relays are stuck-closed. For example, if two or more battery negative relays are stuck-closed, the number of the current paths supplied to the vehicle depends on the number of stuck-closed negative relays. Therefore, compared to the case where one negative relay is stuck-closed, when two or more negative relays are stuck-closed, the battery pack current flowing through the stuck-closed negative relay may be reduced. The second threshold current ITH2 should be set in consideration of these points.

The embodiments described so far may perform the stuck-closed diagnosis for a plurality of positive relays or a plurality of negative relays. However, the disclosure is not limited thereto, and the embodiment may perform the stuck-closed diagnosis for the positive relay and the negative relay connected to each of a plurality of battery packs.

Figure 8:
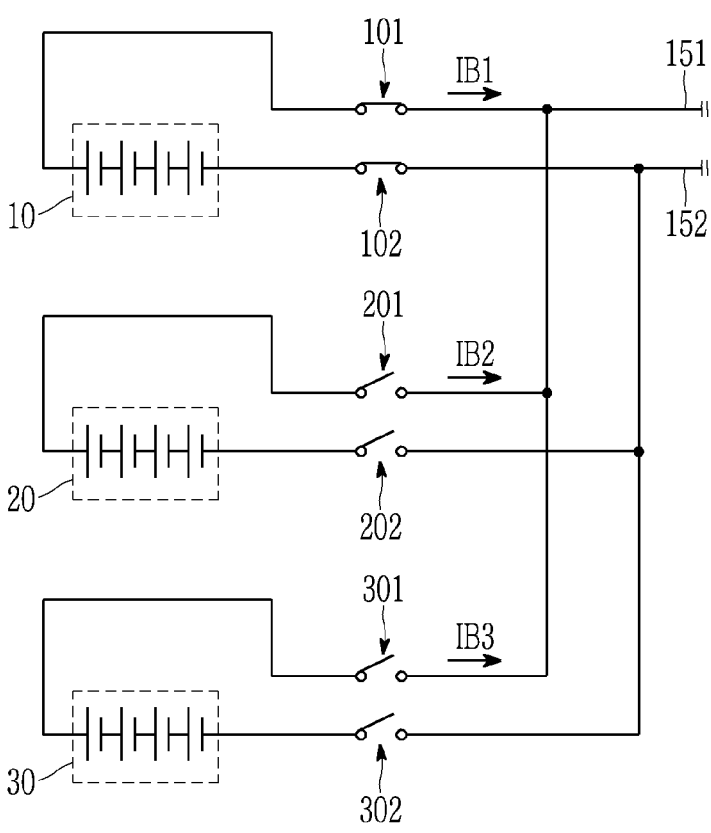
FIG. 8 is a circuit diagram for explaining a method for determining whether a plurality of positive relays and a plurality of negative relays are stuck-closed according to an embodiment.

FIG. 8 is a circuit diagram for explaining a method for determining whether a plurality of positive relays and a plurality of negative relays are stuck-closed according to an embodiment.

Figure 9:
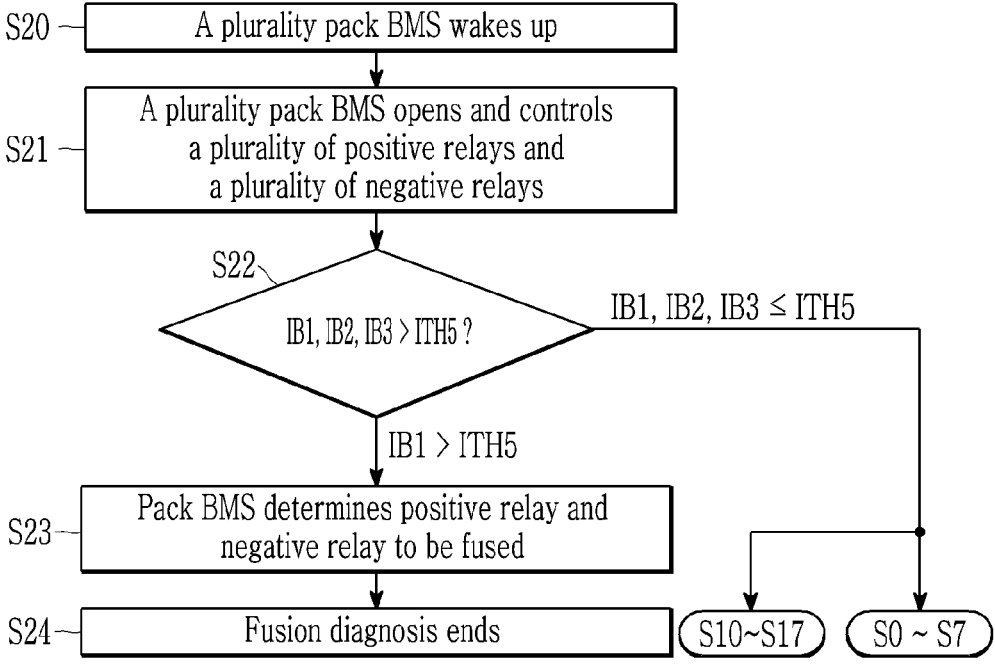
FIG. 9 is a flowchart for explaining a method for determining whether a plurality of positive relays and a plurality of negative relays are stuck-closed according to an embodiment.

FIG. 9 is a flowchart for explaining a method for determining whether a plurality of positive relays and a plurality of negative relays are stuck-closed according to an embodiment.

FIG. 8 shows a plurality of battery packs 10, 20, and 30, and a plurality of positive relays 101, 201, and 301 and a plurality of negative relays 102, 202, and 302, which are connected to each battery pack for convenience of description. In addition, in FIG. 8, the positive relay 101 and the negative relay 102 are shown in a stuck-closed state.

First, each of a plurality of pack BMSs 100, 200, and 300 may wake up for the stuck-closed diagnosis (S20). A monitoring operation for diagnosing the state of battery system 1 may be performed by a plurality of pack BMSs 100, 200, and 300. For example, a plurality of pack BMSs 100, 200, and 300 may wake up every monitoring period to determine whether a plurality of positive relays 101, 201, and 301 and a plurality of negative relays 102, 202, and 302 are stuck-closed.

A plurality of pack BMSs 100, 200, and 300 may open and control a plurality of positive relays 101, 201, and 301 and a plurality of negative relays 102, 202, and 302 (S21).

Each of a plurality of pack BMSs 100, 200, and 300 compares each of the battery pack currents IB1, IB2, and IB3 flowing through each of a plurality of battery packs 10, 20, and 30 with a third threshold current ITH3 under an open control condition (S22). A plurality of battery pack currents IB1, IB2, and IB3 may be measured by a plurality of current sensors 103, 203, and 303, respectively.

As a comparison result of the step S22, if at least one (e.g., IB1) of a plurality of battery pack currents IB1, IB2, and IB3 is greater than the third threshold current ITH3, the pack BMS 100 determines that the positive relay 101 and the negative relay 102 are stuck-closed (S23). In this case, the battery pack currents IB2 and IB3 may be equal to or less than the third threshold current ITH3. After the step S23, each of a plurality of pack BMSs 100, 200, and 300 may terminate the stuck-closed diagnosis (S24).

As a comparison result of the step S22, when a plurality of battery pack currents IB1, IB2, and IB3 are all less than the third threshold current ITH3, each of a plurality of pack BMSs 100, 200, and 300 may perform the positive relay diagnosis through the steps S0 to S7 or the negative relay diagnosis through the steps S10 to S17.

Figure 10:
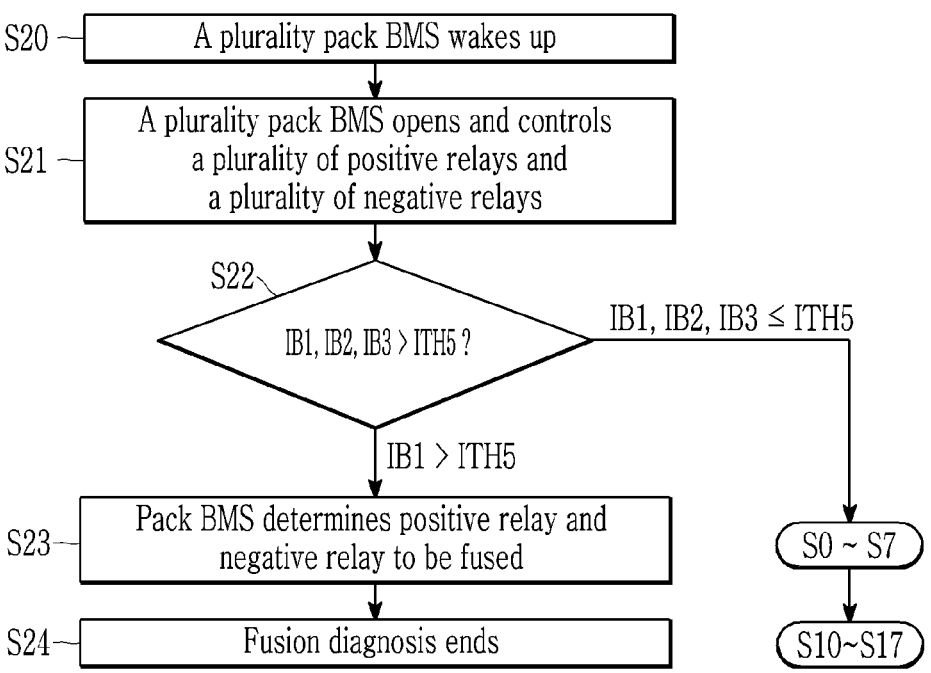
FIG. 10 is a flowchart showing a variation for an embodiment shown in FIG. 9.

FIG. 10 is a flowchart showing a variation for an embodiment shown in FIG. 9.

Figure 11:
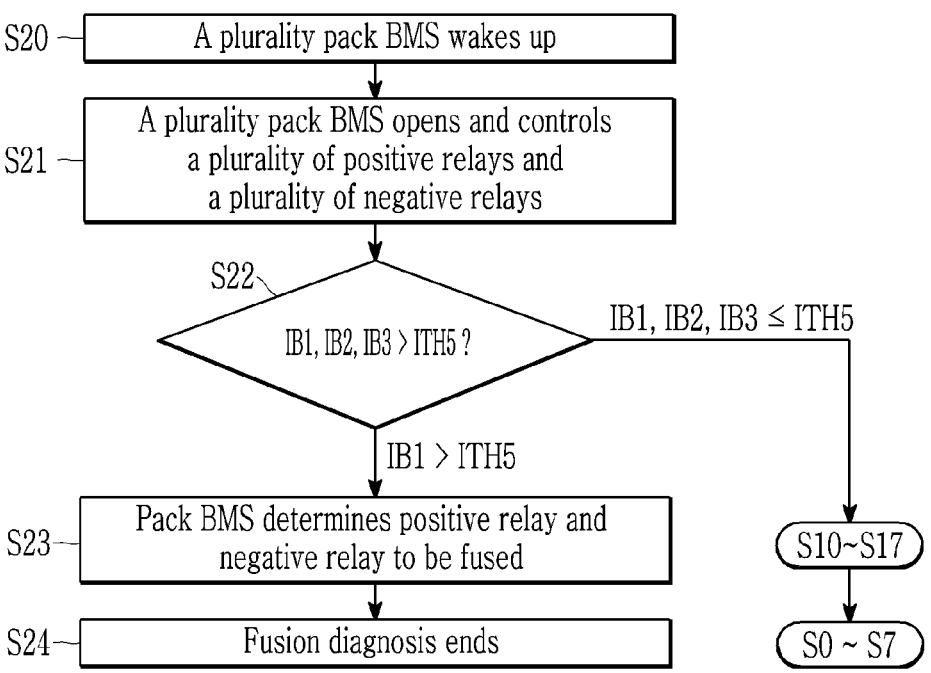
FIG. 11 is a flowchart showing another variation for an embodiment shown in FIG. 9.

FIG. 11 is a flowchart showing another variation for an embodiment shown in FIG. 9.

In each of FIG. 10 and FIG. 11, when all of a plurality of battery pack currents are equal to or less than the third threshold current in the step S22, the subsequent operation is different from the embodiment shown in FIG. 9.

As shown in FIG. 10, each of a plurality of pack BMSs 100, 200, and 300 may perform the negative relay diagnosis (S10 to S17) after performing the positive relay diagnosis (S0 to S7).

Also, as shown in FIG. 11, each of a plurality of pack BMSs 100, 200, and 300 may perform the positive relay diagnosis (S0 to S7) after performing the negative relay diagnosis (S10 to S17).

Figure 12:
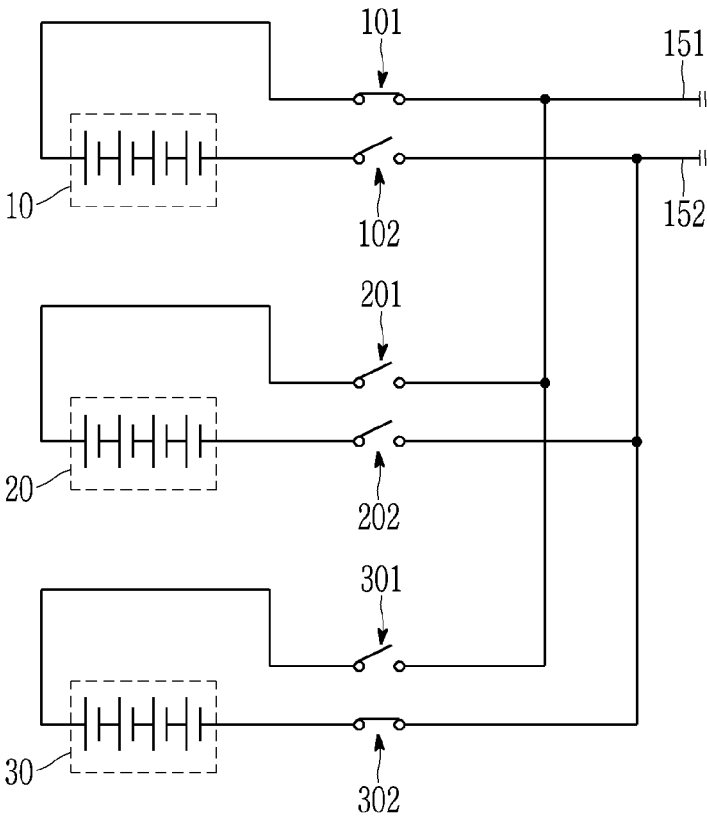
FIG. 12 is a circuit diagram for explaining a method for determining whether a plurality of positive relays and a plurality of negative relays are stuck-closed according to an embodiment.

FIG. 12 is a circuit diagram for explaining a method for determining whether a plurality of positive relays and a plurality of negative relays are stuck-closed according to an embodiment.

As shown in FIG. 12, when the positive relay 101 and the negative relay 302 are stuck-closed, a plurality of pack BMSs 100, 200, and 300 may perform the steps S20 to S23 depending on the method shown in FIG. 9. In the circuit shown in FIG. 10, since a plurality of battery pack currents IB1, IB2, and IB3 are all less than the third threshold current ITH3, the corresponding diagnosis is terminated.

Subsequently, each of a plurality of pack BMSs 100, 200, and 300 may perform the positive relay diagnosis through the steps S0 to S7 and the negative relay diagnosis through the steps S10 to S17. Conversely, each of a plurality of pack BMSs 100, 200, and 300 may perform the negative relay diagnosis through the steps S10 to S17 and the positive relay diagnosis through the steps S0 to S7.

Through this, the pack BMS 100 may determine the stuck-closed of the positive relay 101, and the pack BMS 200 may determine the stuck-closed of the negative relay 302.

Through an embodiment, in the battery system in which a plurality of battery packs are connected in parallel, the relay in which the stuck-closed has occurred among a plurality of relays may be accurately diagnosed.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery system comprising:
   a plurality of battery packs;
   a plurality of positive relays, each respective battery pack including a respective positive relay, connected between a positive electrode and a positive link of the respective battery;
   a plurality of negative relays, each respective battery pack including a respective negative relay, connected between a negative electrode and a negative link of the respective battery pack; and
   a plurality of pack BMSs (Battery Management Systems) connected to the plurality of battery packs in a one-to-one correspondence,
   wherein each pack BMS of the plurality of pack BMSs, in an opening control condition of the plurality of positive relays and the plurality of negative relays, is configured to determine whether the positive relay of the pack BMS's corresponding battery pack is stuck-closed based on a first battery pack current flowing to the pack BMS's corresponding battery pack when the negative relay connected to the pack BMS's corresponding battery back is closed when a voltage difference between terminals of the positive relay of the pack BMS's corresponding battery pack is less than a first threshold voltage.

2. The battery system of claim 1, wherein
   each pack BMS of the plurality of pack BMSs is configured to determine the positive relay connected to the pack BMS's corresponding battery pack to be stuck-closed when the first battery pack current is greater than a first threshold current.

3. The battery system of claim 1, wherein in the opening control condition of the plurality of positive relays and the plurality of negative relays, when the voltage difference between terminals of at least one of the plurality of positive relays is less than the first threshold voltage, the plurality of pack BMSs are configured to sequentially measure respective second battery pack currents flowing through each of the plurality of battery packs while sequentially closing each of the plurality of negative relays one by one.

4. The battery system of claim 1, wherein in the opening control condition of the plurality of positive relays and the plurality of negative relays, when a voltage of the negative link is less than a second threshold voltage, each pack BMS of the plurality of pack BMSs is configured to determine whether the negative relay of the pack BMS's corresponding battery pack is stuck-closed based on a second battery pack current flowing through the pack BMS's corresponding battery pack as each of the plurality of positive relays is sequentially closed one by one.

5. The battery system of claim 4, wherein

Each pack BMS of the plurality of pack BMSs is configured to determine the negative relay of the pack BMS's corresponding battery pack to be stuck-closed when the second battery pack current is larger than a second threshold current.

6. The battery system of claim 1, wherein each pack BMS of the plurality of pack BMSs is configured to determine the positive relay and the negative relay of the pack BMS's corresponding battery pack to be stuck-closed when a battery pack current of any pack BMS's corresponding battery pack is larger than a third threshold current.

7. A battery system comprising:

a plurality of battery packs;

a plurality of positive relays, each respective battery pack including a respective positive relay, connected between a positive electrode and a positive link of the respective battery pack;

a plurality of negative relays, each respective battery pack including a respective negative relay, connected between a negative electrode and a negative link of the respective battery pack; and a plurality of pack BMSs (Battery Management Systems) connected to the plurality of battery packs in a one-to-one correspondence, wherein each pack BMS of the plurality of pack BMSs, in an opening control condition of the plurality of positive relays and the plurality of negative relays, is configured to determine at least one positive relay and at least one negative relay to which at least one battery pack current among a plurality of battery packs flows to be stuck-closed when a battery pack current of any pack BMS's corresponding battery pack is larger than a third threshold current.

8. The battery system of claim 7, wherein each pack BMS of a plurality of pack BMSs is configured to,

in an opening control condition of the plurality of positive relays and the plurality of negative relays, when all of the plurality of battery pack currents are below the third threshold current, determine a positive relay connected to the pack BMS's corresponding battery pack is stuck-closed based on a first battery pack current flowing to the corresponding battery pack when a negative relay connected to the pack BMS's corresponding battery pack is closed, when a voltage difference between terminals of the positive relay of the pack BMS's corresponding battery pack is less than a first threshold voltage.

9. The battery system of claim 7, wherein each pack BMS of the plurality of pack BMSs is configured to, in the opening control condition of the plurality of positive relays and the plurality of negative relays, when all of the plurality of battery pack currents are below the third threshold current, determine whether a negative relay connected to the pack BMS's corresponding battery pack is stuck-closed based on a second battery pack current flowing to the pack BMS's corresponding battery pack when a positive relay connected to the pack BMS's corresponding battery pack is closed, when a voltage of the negative link is less than a second threshold voltage.

10. A stuck-closed diagnosis method for a plurality of positive relays, each respective battery pack including a respective positive relay, connected to a positive electrodes of the respective a battery pack and a negative relay of the respective battery pack, the method comprising:

configuring each pack BMS of a plurality of pack BMSs connected to the respective battery pack to perform:

comparing a voltage difference between terminals of each of the plurality of positive relays with a first threshold voltage in an opening control condition and each of the plurality of negative relays;

sequentially closing the plurality of negative relays one by one when at least one of the voltage difference is less than the first threshold voltage;

comparing a respective battery pack current flowing through each of the plurality of battery packs with a first threshold current; and determining at least one positive relay to be stuck-closed when at least one of a plurality of battery pack currents flowing through each of the plurality of battery packs is greater than a first threshold current.

11. The method of claim 10, wherein configuring each pack BMS of a plurality of pack BMSs connected to the respective battery pack to further performs:

comparing a voltage of a negative link connected to the negative electrode of the pack BMS's corresponding battery pack with a second threshold voltage in an opening control condition of the plurality of positive relays and the plurality of negative relays;

sequentially closing the plurality of positive relays one by one when the voltage of the negative link is less than the second threshold voltage;

comparing a battery pack current flowing through each of the plurality of battery packs with a second threshold current; and determining at least one negative relay to be stuck-closed when at least one of a plurality of battery pack currents flowing through each of the plurality of battery packs is greater than the second threshold current.

\* \* \* \* \*